(12) United States Patent
Fujishima et al.

(10) Patent No.: US 7,445,982 B2
(45) Date of Patent: Nov. 4, 2008

(54) METHOD OF MANUFACTURING A SEMICONDUCTOR INTEGRATED CIRCUIT DEVICE

(75) Inventors: Naoto Fujishima, Tokyo (JP); C. Andre T. Salama, Toronto (CA)

(73) Assignee: Fuji Electric Co., Ltd., Kawasaki (JP)

( * ) Notice: Subject to any disclaimer, the term of this patent is extended or adjusted under 35 U.S.C. 154(b) by 0 days.

(21) Appl. No.: 11/892,928

(22) Filed: Aug. 28, 2007

(65) Prior Publication Data
US 2007/0298563 A1    Dec. 27, 2007

Related U.S. Application Data

(62) Division of application No. 10/920,247, filed on Aug. 18, 2004, now Pat. No. 7,344,935, which is a division of application No. 10/272,304, filed on Oct. 17, 2002, now Pat. No. 6,800,904.

(51) Int. Cl.
*H01L 21/8238* (2006.01)
(52) U.S. Cl. .................. 438/200; 438/204; 438/206; 438/224; 438/228; 438/270; 438/275; 438/589
(58) Field of Classification Search ......... 438/199–200, 438/204, 206, 228, 270, 274, 589
See application file for complete search history.

(56) References Cited

U.S. PATENT DOCUMENTS

| 5,096,843 | A | * | 3/1992 | Kodaira | 438/207 |
| 6,130,454 | A | | 10/2000 | Gardner et al. | 257/330 |
| 6,177,704 | B1 | | 1/2001 | Suzuki et al. | 257/343 |
| 6,316,807 | B1 | | 11/2001 | Fujishima et al. | 257/333 |
| 6,781,197 | B2 | * | 8/2004 | Fujishima et al. | 257/329 |

(Continued)

FOREIGN PATENT DOCUMENTS

JP    04-306881    10/1992

(Continued)

OTHER PUBLICATIONS

Akio Kitamura, et al., "Self-Isolated and High Performance Complementary Lateral MOSFETs With Surrounding-Body Regions", Proceedings of 1995 Intl. Symposium On Power Semiconductor Devices & ICs., Yokohama.

(Continued)

*Primary Examiner*—M. Wilczewski
*Assistant Examiner*—Toniae M. Thomas

(57) ABSTRACT

A method of manufacturing a semiconductor integrated circuit (IC) device that integrates a TLPM (trench lateral power MOSFET) and one or more planar semiconductor devices on a semiconductor substrate. In manufacturing the semiconductor IC device according to one embodiment, a trench etching forms a trench. A p-type body region, an n-type expanded drain region, and a thick oxide film are formed. A second trench etching deepens the trench. Gate oxide films and gate electrodes of the TLPM, an NMOSFET, and a PMOSFET are formed. P-type base regions of the TLPM and an NPN bipolar transistor are formed. An n-type source and drain region of the TLPM, and n-type diffusion regions of the NMOSFET and the NPN bipolar transistor are formed. P-type diffusion regions of the PMOSFET and the NPN bipolar transistor are formed. An interlayer oxide film, a contact electrode, and constituent metal electrodes are formed.

7 Claims, 15 Drawing Sheets

U.S. PATENT DOCUMENTS

| | | | |
|---|---|---|---|
| 6,800,904 | B2 | 10/2004 | Fujishima et al. |
| 6,858,500 | B2 * | 2/2005 | Sugi et al. .................. 438/270 |
| 2004/0032005 | A1 | 2/2004 | Williams et al. ............ 257/510 |
| 2004/0063291 | A1 | 4/2004 | Williams et al. ............ 438/309 |

FOREIGN PATENT DOCUMENTS

| | | |
|---|---|---|
| JP | 2002-141501 | 5/2000 |
| JP | 2000-323706 | 11/2000 |
| JP | 2002-280549 | 9/2002 |

OTHER PUBLICATIONS

N. Fujishima, et al., "A High Density, Low On-resistance, Trench Lateral Power MOSFET with a Trench Bottom Source Contact", Proceedings of 2001 Intl. Symposium on Power Semiconductor Devices & ICs., Osaka.

N. Fujishima et al., A High Density, Low On-resistance, Trench Lateral Power MOSFET with a Trench Bottom Source Contact, IEEE Transactions on Electron Devices, vol. 49, No. 8, Aug. 2002.

U.S. Appl. No. 10/920,247, filed Aug. 18, 2004, Naoto Fujishima et al., Fuji Electric Co., Ltd.

* cited by examiner

METHOD OF MANUFACTURING A SEMICONDUCTOR INTEGRATED CIRCUIT DEVICE

CROSS-REFERENCE TO RELATED APPLICATIONS

This application is a divisional of application Ser. No. 10/920,247, filed Aug. 18, 2004, now U.S. Pat. No. 7,344,935, which is a divisional of application Ser. No. 10/272,304, filed Oct. 17, 2002, now U.S. Pat. No. 6,800,904.

This application is based upon and claims priority benefit to U.S. patent application Ser. No. 10/272,304, filed Oct. 17, 2002, and U.S. patent application Ser. No. 10/920,247, filed Aug. 18, 2004, the contents being incorporated herein by reference.

BACKGROUND OF THE INVENTION

1. Field of the Invention

The invention relates to a semiconductor integrated circuit (IC) device having a high breakdown voltage for controlling a high current, and to a method of manufacturing the semiconductor integrated circuit device. The semiconductor integrated circuit device according to the invention may be used as an IC for a switching power supply, an IC for driving the power system of an automobile, and an IC for driving a flat panel display. Specifically, the invention relates to a semiconductor integrated circuit device that incorporates a trench lateral power metal-oxide-semiconductor field-effect transistor (MOSFET) and one or more planar semiconductor devices, such as a planar MOSFET and a bipolar transistor, on a semiconductor substrate, and the method of manufacturing the semiconductor integrated circuit device.

2. Description of the Related Art

Recently, portable instruments have been widely used, and intelligent communication technologies have been developed. In association with these movements, power ICs that incorporate power MOSFETs have become very important devices. The conventional power IC combines a discrete power MOSFET and a control and drive circuit. In contrast, the new power IC developed recently integrates lateral power MOSFETs into a control circuit. It is required that the new power IC provide reductions in size, electric power consumption, and manufacturing costs thereof, and improve the reliability thereof. To meet these requirements, research and development of lateral power MOSFETs exhibiting a high breakdown voltage and being based on the CMOS process have been vigorously explored.

Usually, the planar power MOSFETs are manufactured using a process very similar to the process for manufacturing planar devices such as bipolar complementary metal-oxide semiconductors (BiCMOSs). Therefore, it is easy to obtain a one-chip power IC by forming a planar power MOSFET and the other planar semiconductor devices on a semiconductor substrate through the CMOS process. However, the integration density of the planar power MOSFET is not very high and improvement of the channel density of the planar power MOSFET, which reduces the on-resistance, is subject to certain limitations because the expanded drain region of the planar power MOSFET is formed along the substrate surface. Therefore, low efficiency of the power supply results and it becomes necessary to use a radiation fin or a large package with low thermal resistance to realize extremely low on-resistance for the power ICs.

Trench lateral power MOSFETs (TLPMs) have been proposed. For example, the present inventors have proposed TLPMs in "A High Density Low On-resistance, Trench Lateral Power MOSFET with a Trench Bottom Source Contact", International Symposium on Power Semiconductor Devices and ICs (ISPD) Proceedings, pp. 143-146, 2001, and in U.S. Pat. No. 6,316,807B1. The trench lateral power MOSFETs facilitate high integration density. The trench lateral power MOSFETs are more advantageous than the planar power MOSFETs because the on-resistance of the trench lateral power MOSFETs is lower than that of the planar power MOSFETs.

FIG. 14 is a cross-sectional view of the active region of a conventional TLPM, which drives a current as a MOSFET FIG. 15 is a cross-sectional view of the gate region of the conventional TLPM, which leads the gate electrode to the substrate surface.

FIGS. 14 and 15 illustrate a p-type semiconductor substrate 11, a p-type base region 12, an n-type source region 13, a p-type body region 14, an n-type expanded drain region 15, an n-type drain region 16, a trench 17, a gate oxide film 18, a gate electrode 19, a thick oxide film 20, an interlayer oxide film 21, a contact electrode 22, an oxide film 23, a metal source electrode 24, a metal drain electrode 25, and a metal gate electrode 26.

The TLPM having the structure described above is a discrete device. In other words, neither a power IC that integrates a TLPM and a BiCMOS device constituting a control circuit and a protection circuit on a semiconductor substrate, nor any method of manufacturing such a power IC has been realized yet. According to the prior art, a TLPM and an IC for a control circuit and a protection circuit are mounted on a wiring base plate and connected to one another via wires, for example.

The combined system, which combines a discrete TLPM and an IC for a control and protection circuit, poses problems such as an increase in cost caused by an increase in the number of constituent parts and elements and assembly steps, an increase in system size, and a reduction in reliability, as well as noise caused by the elongated wires for feeding gate signals.

SUMMARY OF THE INVENTION

In view of the foregoing, it is an object of the present invention to provide a semiconductor integrated circuit device that integrates a TLPM and one or more planar semiconductor devices on a semiconductor substrate. It is another object of the present invention to provide a method of manufacturing the semiconductor integrated circuit device described above.

According to one aspect of the present invention, a semiconductor integrated circuit device comprises a semiconductor substrate, a planar MOSFET that exhibits a low breakdown voltage, and a trench lateral MOSFET that exhibits a high breakdown voltage. The trench lateral MOSFET comprises a trench formed in the semiconductor substrate. A thick oxide film is formed on an upper half of an inner side wall of the trench. A gate oxide film is formed on a lower half of the inner side wall of the trench. A gate electrode is formed along the side wall of the trench and is formed on the thick oxide film and the gate oxide film. A contact electrode is formed in the trench and is spaced apart from the gate electrode by an interlayer insulation film that is interposed between the contact electrode and the gate electrode. A source region having a first conductivity type is formed in the bottom of the trench and is connected to the contact electrode. A base region having a second conductivity type surrounds the source region. An expanded drain region having the first conductivity type surrounds the thick oxide film from outside the trench. A drain region having the first conductivity type is formed in a surface portion of the semiconductor substrate and surrounds the trench. A metal contact electrode is connected to the contact electrode, and a metal drain electrode is connected to the drain region.

In another aspect of the present invention, a semiconductor integrated circuit device is manufactured by conducting a first trench etching to form a trench in the region of a semiconductor substrate for forming a TLPM. A body region and an expanded drain region are formed around the trench. A thick oxide film is formed only on the inner side wall of the trench. A second trench etching is performed to deepen the trench. A gate oxide film for the TLPM and gate oxide films for the planar MOSFETs are formed simultaneously. A gate electrode for the TLPM and gate electrodes for the planar MOSFETs are also simultaneously formed, as well as a base region for the TLPM and a base region for a planar bipolar transistor. A source region and a drain region of one conductivity type for the TLPM, regions of the one conductivity type for the source and the drain of one of the planar MOSFETs, and regions of the one conductivity type for the emitter and the collector of the planar bipolar transistor are simultaneously formed. Regions of the other conductivity type for the source and the drain of the other one of the planar MOSFETs and a region of the other conductivity type for the base of the planar bipolar transistor are simultaneously formed. A contact electrode is buried in the trench through an interlayer insulation film, and constituent metal electrodes are formed.

The semiconductor integrated circuit device according to a preferred embodiment of the present invention integrates a TLPM and a BiCMOS on the same semiconductor substrate, and is obtained by adding the process of forming a trench to the process of forming a BiCMOS.

These, together with other aspects and advantages that will be subsequently apparent, reside in the details of construction and operation as more fully hereinafter described and claimed, reference being had to the accompanying drawings forming a part hereof, wherein like numerals refer to like parts throughout.

DETAILED DESCRIPTION OF THE PREFERRED EMBODIMENTS

In the following description for preferred embodiments of the semiconductor integrated circuit device, although the first conductivity type is a p-type and the second conductivity type is an n-type, the invention is applicable to a semiconductor integrated circuit device in which the first conductivity type is an n-type and the second conductivity type is a p-type.

Figure 1:
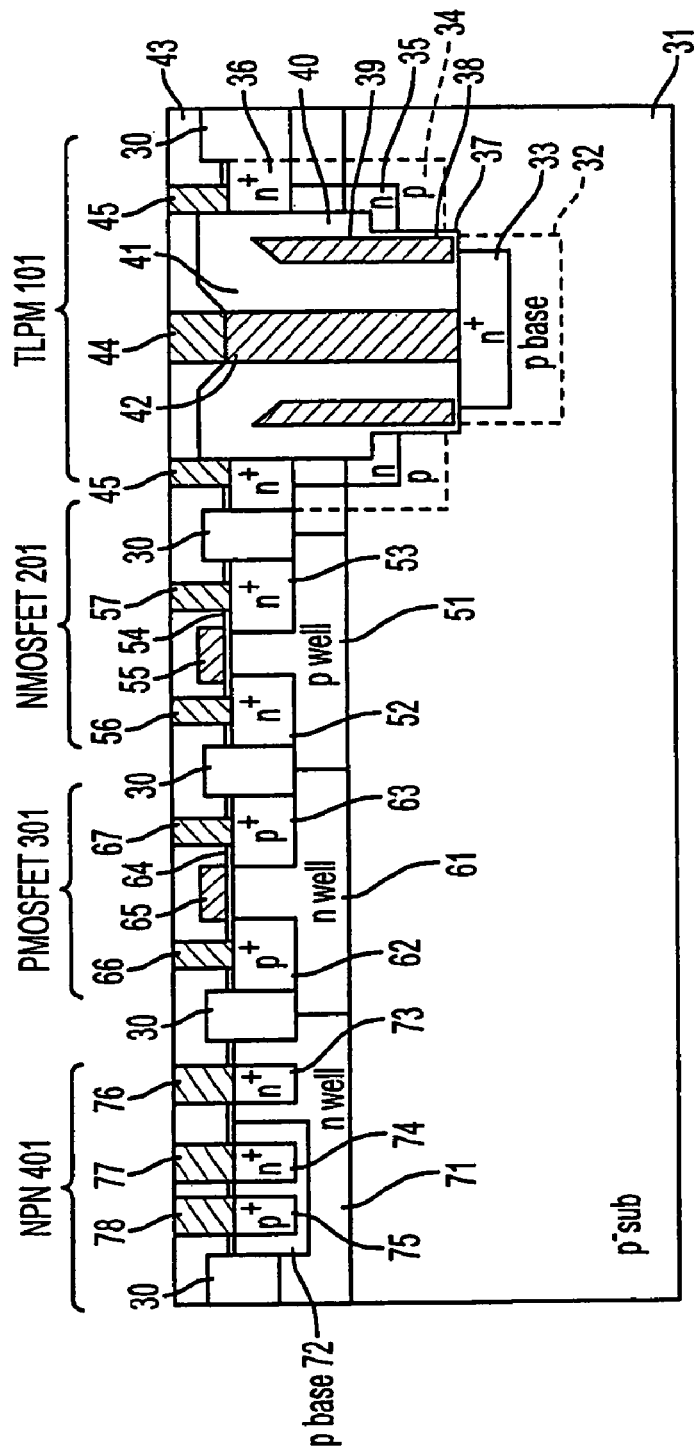
FIG. 1 is a cross sectional view of the active region of a semiconductor integrated circuit device according to an embodiment of the invention.

FIG. 1 is a cross sectional view of the active region of a semiconductor integrated circuit device according to a first embodiment of the present invention.

Referring to FIG. 1, the semiconductor integrated circuit device according to a first embodiment of the present invention includes a TLPM 101, an NMOSFET 201, a PMOSFET 301, and an NPN bipolar transistor 401, which are formed on a p-type semiconductor substrate 31. The NMOSFET 201 and PMOSFET 301 constitute a CMOS device. Other devices, not shown in FIG. 1, such as diffusion resistance and capacitance, may be formed on the p-type semiconductor substrate 31. The devices formed on the substrate 31 are isolated from each other by a local oxidation of silicon (LOCOS) oxide film 30, which is a selective oxide film.

The structure of the TLPM 101 is described as follows. A plurality of n-type well regions is formed on the side of a major surface of substrate 31. A trench 37 is formed through one of the n-type well regions 81 (see FIG. 2). A gate electrode 39 is formed along the side wall of trench 37. A thick oxide film 40 is formed between the side wall of trench 37 and the gate electrode 39 in the upper half of the trench 37. A thin gate oxide film 38 is formed between the side wall of the trench 37 and the gate electrode 39 in the lower half of the trench 37. A contact electrode 42 is formed inside the trench 37 and insulated from the gate electrode 39 by an interlayer insulation film 41 interposed therebetween. The gate electrode 39 and the contact electrode 42 are made, for example, of polysilicon.

Contact electrode 42 is connected to an n-type source region 33 formed in the bottom of the trench 37. The n-type source region 33 is surrounded by a p-type base region 32 formed in the bottom of trench 37. An n-type drain region 36 surrounds the upper edge portion of the trench 37. An n-type expanded drain region 35 is connected to the n-type drain region 36 and extended along the side wall of the trench 37 to the vicinity of the gate oxide film 38. A p-type body region 34 surrounds the n-type expanded drain region 35.

Figure 15:
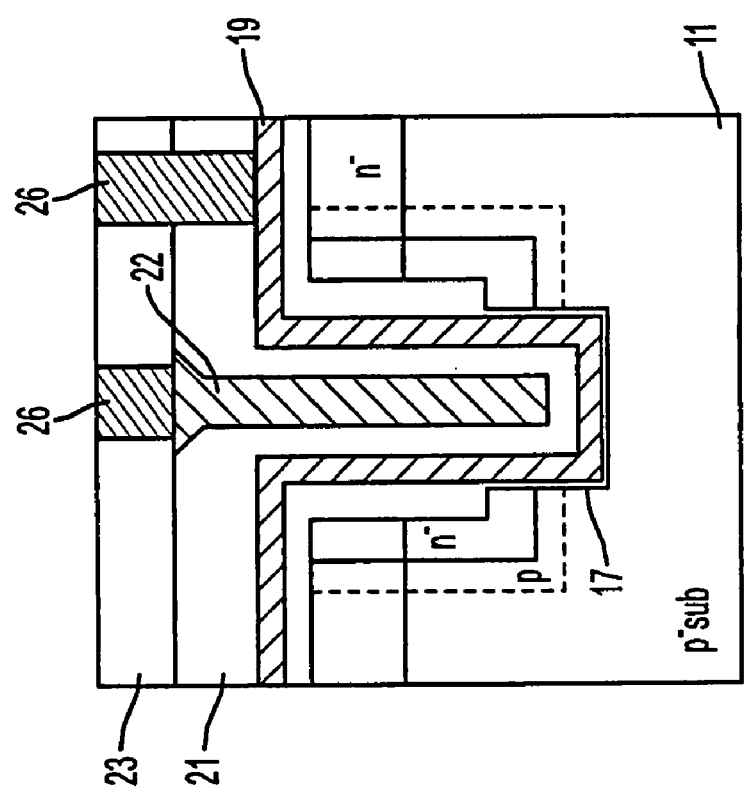
FIG. 15 is a cross-sectional view of the gate region of the conventional TLPM of FIG. 14.

An oxide film 43, which is an insulation film, is laminated on the interlayer oxide film 41. A metal source electrode 44 and a metal drain electrode 45 are connected via contact holes bored through the oxide film 43 and the interlayer oxide film 41 to contact the electrode 42 and the n-type drain region 36, respectively. Although not illustrated, the gate electrode 39 is led out to the substrate 31 surface in the gate region. A metal gate electrode (not shown) is connected via a contact hole bored through the oxide film 43 and the interlayer oxide film 41 to the led out portion of the gate electrode 39, which is led out to the substrate 31 surface (see FIG. 15).

The structure of the NMOSFET 201 is described as follows.

The NMOSFET 201 is formed in a p-type well region 51, which is formed on the major surface side of the p-type semiconductor substrate 31. Two n-type diffusion regions 52 and 53, one of which operates as a source or a drain of the NMOSFET 201 and the other one of which operates as a drain or a source of the NMOSFET 201, are formed selectively in the surface portion of the p-type well region 51. A gate electrode 55 is formed above the channel region between the n-type diffusion regions 52 and 53, with a gate oxide film 54 interposed between the gate electrode 55 and the channel region.

Metal electrodes 56 and 57 are connected via the respective contact holes bored through the oxide film 43 and interlayer oxide film 41 to n-type diffusion regions 52 and 53, respectively. A metal gate electrode (not shown) is connected to the gate electrode 55.

The structure of the PMOSFET 301 is described as follows.

The PMOSFET 301 is formed in an n-type well region 61, which is formed on the major surface side of the p-type semiconductor substrate 31. Two p-type diffusion regions 62 and 63, one of which operates as a source or a drain of the PMOSFET 301, and the other one of which operates as a drain or a source of the PMOSFET 301, are formed selectively in the surface portion of the n-type well region 61. A gate electrode 65 is formed above the channel region between the p-type diffusion regions 62 and 63, with a gate oxide film 64 interposed between the gate electrode 65 and the channel region.

Metal electrodes 66 and 67 are connected via the respective contact holes bored through oxide film 43 and interlayer oxide film 41 to the p-type diffusion regions 62 and 63, respectively. A metal gate electrode (not shown) is connected to the gate electrode 65.

The structure of the NPN bipolar transistor 401 is described as follows.

The NPN bipolar transistor 401 is formed in an n-type well region 71, which is formed on the major surface side of the p-type semiconductor substrate 31. A p-type base region 72 and an n-type diffusion region 73, which operates as an emitter or a collector of the NPN bipolar transistor 401, are formed selectively in the surface portion of the n-type well region 71. An n-type diffusion region 74, which operates as a collector or an emitter of the NPN bipolar transistor 401, and a heavily doped p-type diffusion region 75, are formed selectively in the surface portion of the p-type base region 72.

Contact holes are selectively bored through the oxide film 43 and interlayer oxide film 41 formed in the surface portion of the substrate 31. Metal electrodes 76 and 77 are connected via the respective contact holes to the n-type diffusion regions 73 and 74, respectively. A metal base electrode 78 is connected via one of the contact holes to the p-type diffusion region 75.

For purposes of illustration, the breakdown voltage of the NPN bipolar transistor 401 is about 30 V and the current amplification factor thereof is about 30. The threshold voltages of the NMOSFET 201 and the PMOSFET 301 are approximately 0.8 V and the breakdown voltages thereof are approximately 10 V. The threshold voltage of the TLPM 101 is about 0.8 V and the breakdown voltage thereof is about 80 V. This high breakdown voltage is realized by the electric field relaxation due to the thick oxide film 40 that is formed on the upper half portion of the side wall of the trench 37, and has a thickness of about 0.6 μm, for example.

Gate oxide films 38, 54, and 64 in the TLPM 101, the NMOSFET 201, and the PMOSFET 301, respectively, are about 0.02 μm in thickness. The threshold voltages of the TLPM 101, the NMOSFET 201, and the PMOSFET 301 are set lower than about 1 V by optimizing the impurity concentrations in the p-type base regions. Therefore, the gate drive of the TLPM 101 is conducted by the CMOS device.

Because the TLPM 101 is usually used as a power MOS switch in synchronous rectifier circuits and step-up-type switching power supply circuits, the TLPM 101 drives a current of several amperes, which is high for the IC. To facilitate driving a high current, the planar patterns of the metal source electrode 44 and the metal drain electrode 45 of the TLPM 101 are comb-tooth shaped, and the teeth of the electrodes 44 and 45 are arranged in an inter-digital fashion. The inter-digital arrangement of the comb-tooth-shaped metal source electrode 44 and the comb-tooth-shaped metal drain electrode 45 facilitates obtaining a high current density.

The NPN bipolar transistor 401 and similar devices are used in high precision reference voltage circuits, such as analog circuits. When it is not necessary to use a bipolar device, a CMOS device and a TLPM are formed on the same semiconductor substrate.

Other constituent elements formed on the p-type semiconductor substrate 31 include diffusion resistance and capacitance, which are formed, if necessary, by the well regions and the polysilicon layers deposited for forming the gate electrodes. A double layer wiring structure may be used to integrate the constituent circuits at a high density and to reduce the wiring resistance of a power supply and the wiring resistance of the TLPM 101. A polysilicon double layer structure may be used to form highly precise polysilicon capacitance independent of the applied voltage.

The method of manufacturing the semiconductor integrated circuit device of FIG. 1 is described as follows according to a second embodiment of the present invention, with reference to FIGS. 2 through 13.

Figure 2:
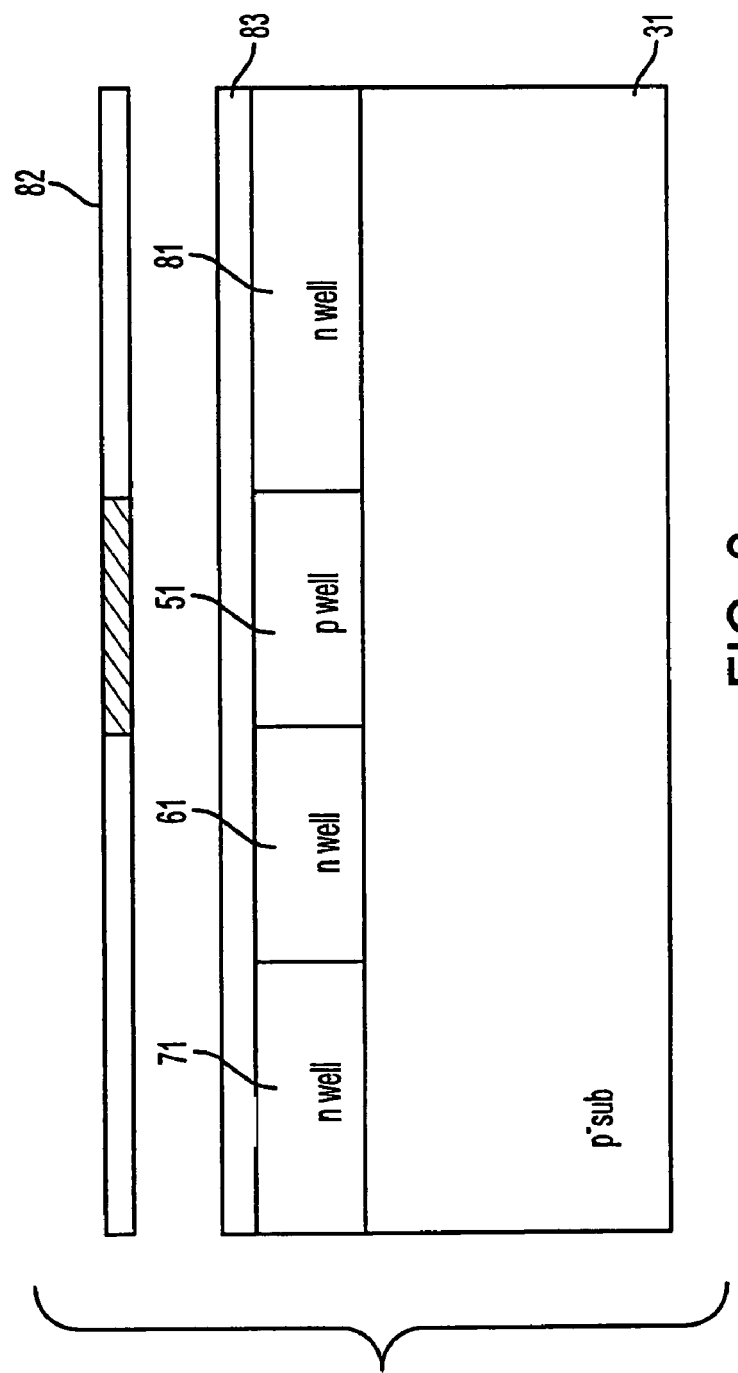
FIGS. 2 through 13 are cross-sectional views illustrating the manufacturing process of the semiconductor integrated circuit device shown in FIG. 1.

Referring to FIG. 2, an oxide film 83 is formed on a p-type semiconductor substrate 31, the specific resistance thereof being about 12 Ω/cm, and a nitride film (not shown) is formed on the oxide film. A photo-resist film (not shown) is coated on the nitride film. The photo-resist film is exposed and developed using a mask 82 having the patterns for forming n-type well regions 61, 71, and 81. The portions of the oxide film and the nitride film corresponding to the n-type well regions 61, 71, and 81 are removed by etching. In FIG. 2, the light-reducing portion of the mask 82 is illustrated by hatch marks.

After removing the remaining resist film, phosphorus ions are implanted using the remaining nitride film as a mask. The exposed surface portions of substrate 31 are oxidized and the implanted phosphorus atoms are driven to form the n-type well regions 61, 71 and 81. Then, the remaining nitride film is removed. A p-type well region 51 is formed by implanting boron ions using the oxide films formed on the n-type well regions 61, 71 and 81 as a mask and by driving the implanted boron atoms. Then, an oxide film 83 is formed on the substrate surface.

Figure 3:
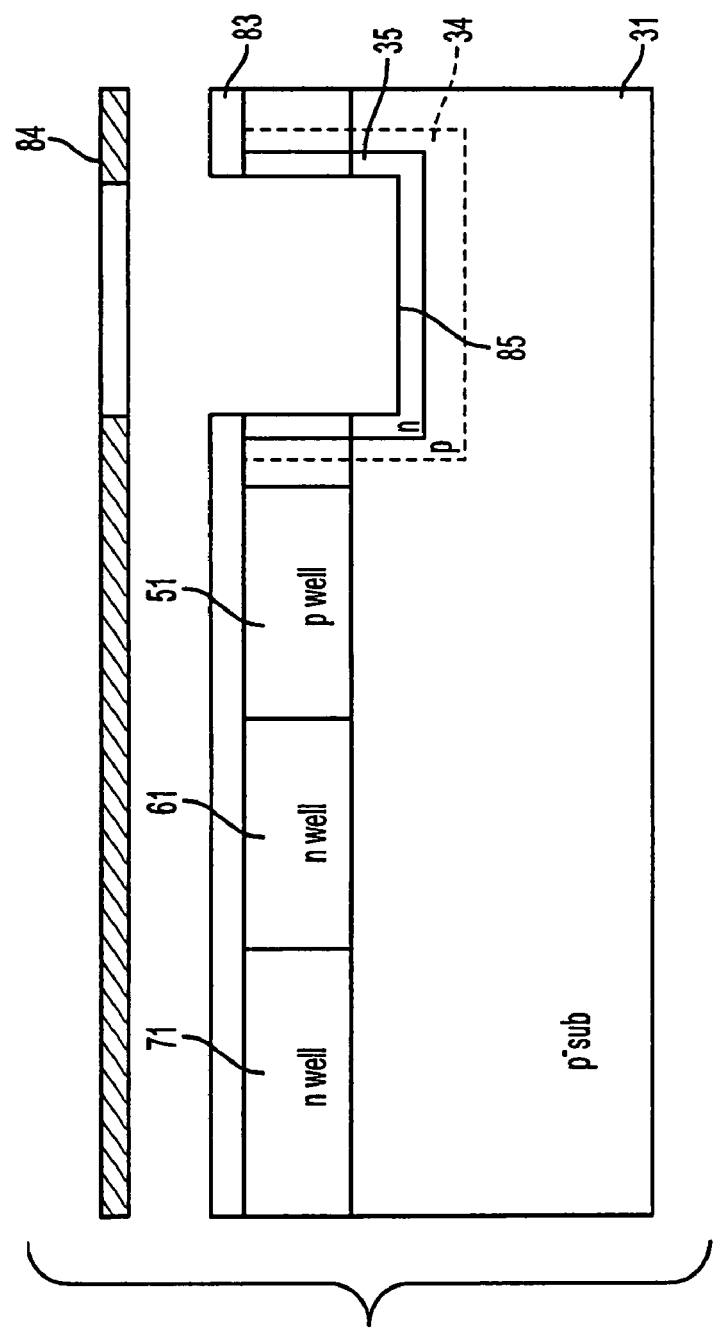

Referring to FIG. 3, the oxide film 83 on the substrate surface is selectively removed using a mask 84, having a pattern for forming the trench 37, which opens the surface area of the substrate 31. Then, a trench 85 is formed by reactive ion etching (RIE) and an anisotropic etching technique. A p-type body region 34 is formed by implanting boron ions obliquely to the side wall of the trench 85 and by driving the implanted boron atoms. Then, an n-type expanded drain region 35 is formed by implanting phosphorus ions obliquely to the side wall and the bottom surface of the trench 85 and by driving the implanted phosphorus atoms.

Figure 4:
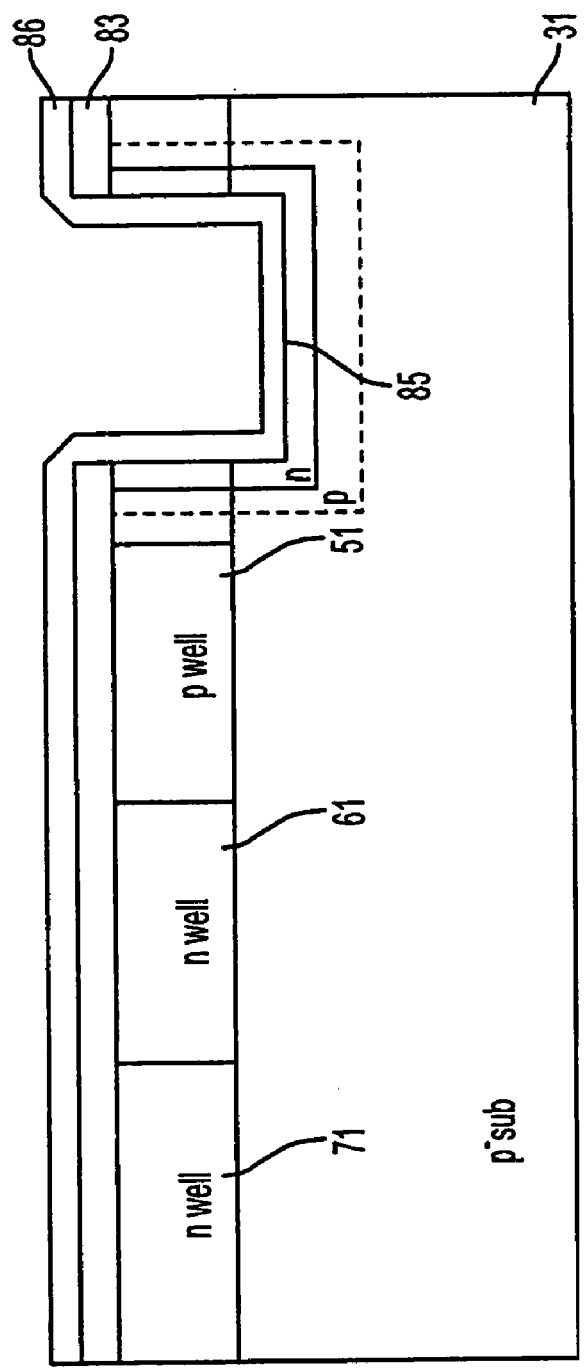

Referring to FIG. 4, an oxide film 86 is formed on the inner surface of trench 85 and on the substrate surface.

Figure 5:
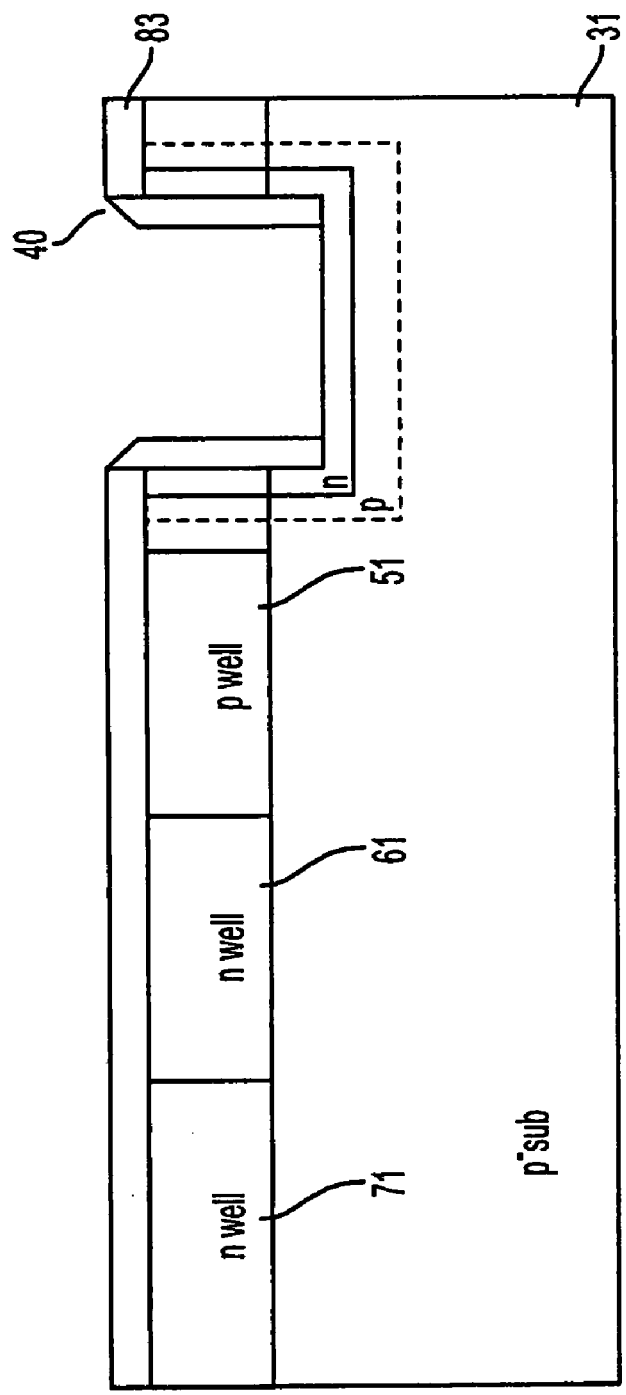

Referring to FIG. 5, the portion of the oxide film 86 on the substrate surface and the portion of the oxide film 86 on the bottom surface of the trench 85 are removed by anisotropic etching. A thick oxide film 40 is left on the side wall of the trench 85.

Figure 6:
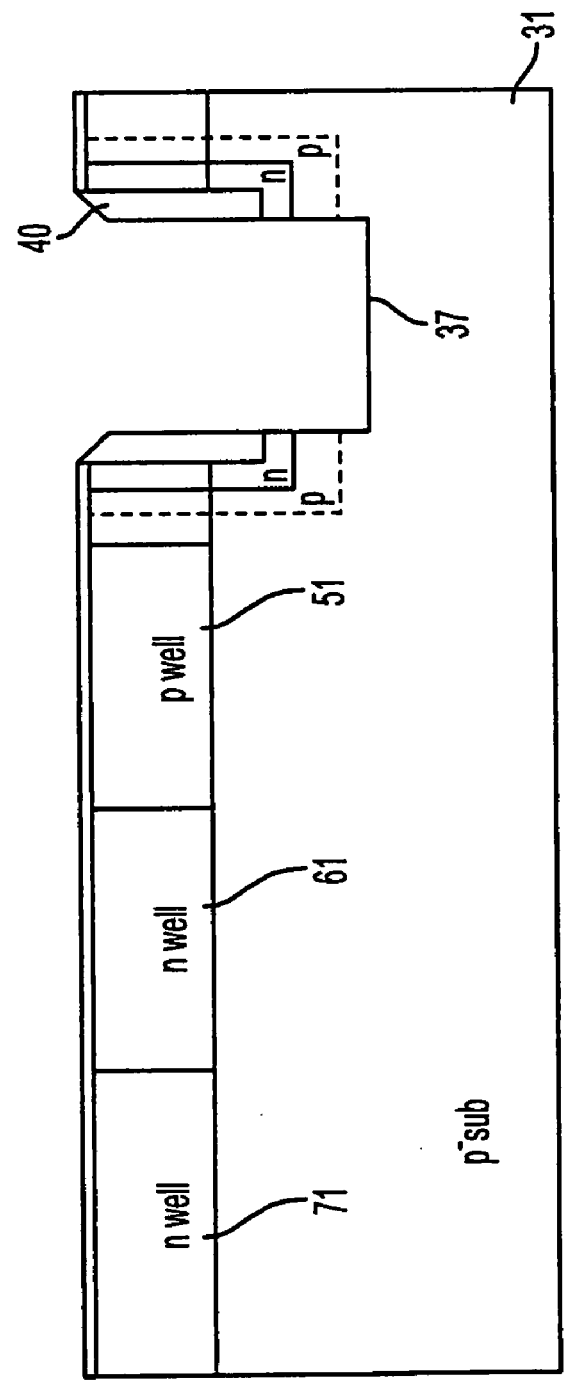

Referring to FIG. 6, the final shape of the trench 37 is obtained by a second trench etching, which digs about 2 μm through the bottom of the trench 85 using the thick oxide film 40 as a mask. Then, the oxide film 83 on the substrate surface is removed by anisotropic etching.

Figure 7:
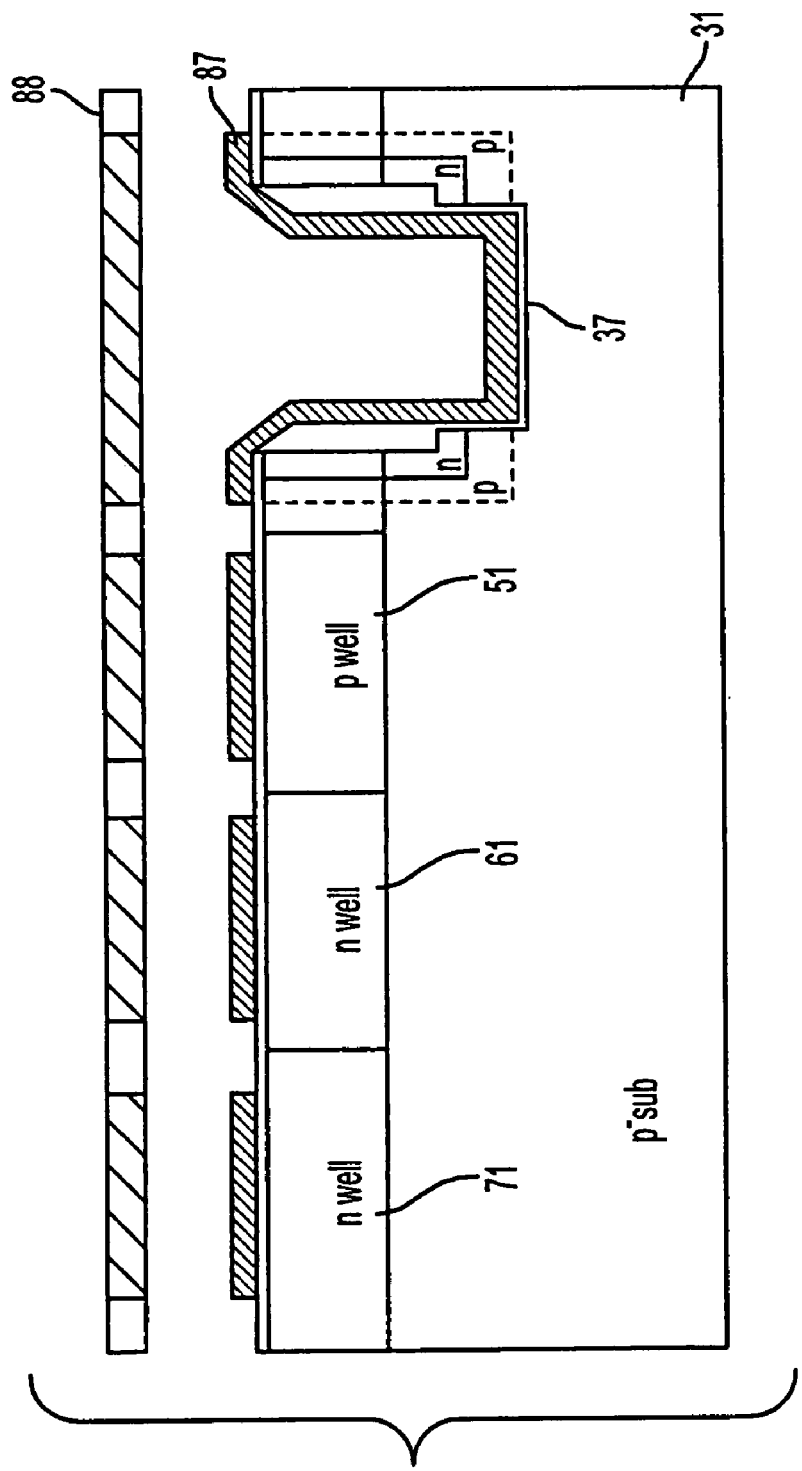

Referring to FIG. 7, the substrate 31 surface and the trench 37 bottom surface are cleaned by sacrifice etching. Then, an oxide film of about 35 nm in thickness, for example, is formed. A nitride film 87 of about 15 nm in thickness is formed on the substrate 31 surface and the inner surface of the trench 37. A resist mask (not shown) is formed on the nitride film 87 using a mask 88 having a pattern for forming a LOCOS film. Then, the nitride film 87 is selectively removed by chemical dry etching (CDE: dry process) using mask 88.

Figure 8:
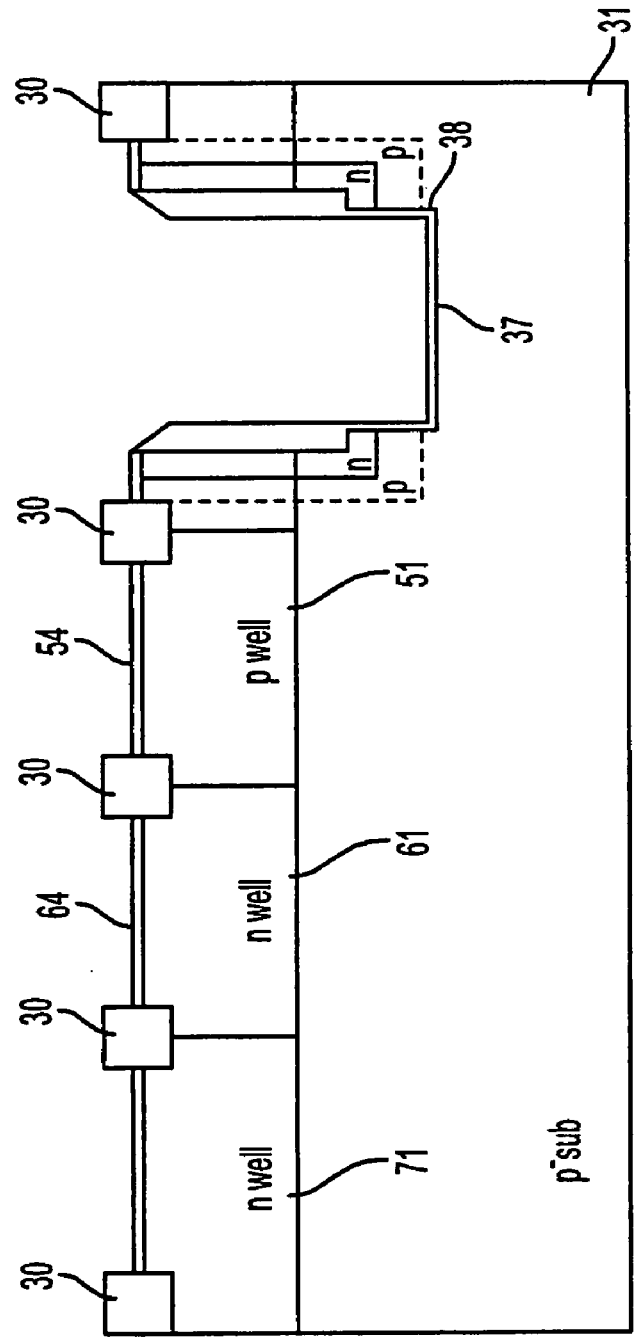

Referring to FIG. 8, the surface impurity concentration of the p-type well region 51 is increased by implanting $BF_2$ to a portion of the substrate 31, from which the nitride film 87 is removed, to prevent the parasitic field MOS from working. Then, a LOCOS oxide film 30 of about 0.6 μm in thickness is formed by selective oxidation. Then, the nitride film 87 is removed. The surface of the active region is cleaned by forming a sacrifice oxide film and then by removing the sacrifice oxide film. A gate oxide film 38 for the TPLM 101 and gate oxide films 54 and 64 for the CMOS device are formed.

Figure 9:
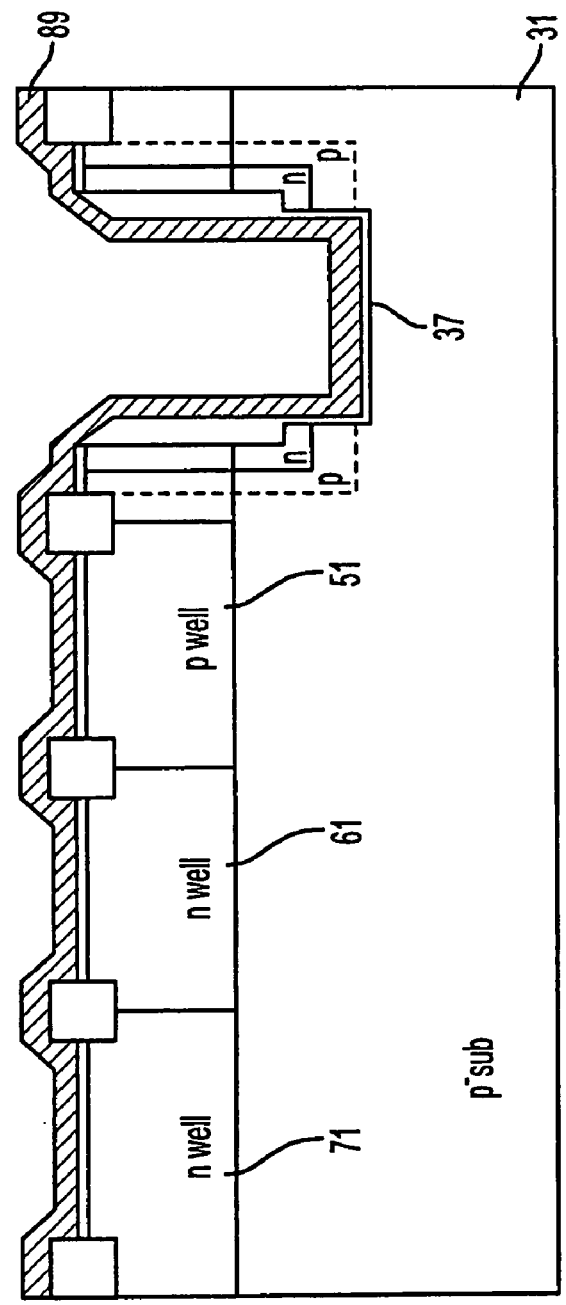

Referring to FIG. 9, a polysilicon layer 89 is deposited on the surface of the substrate 31 and the inner surface of the trench 37.

Figure 10:
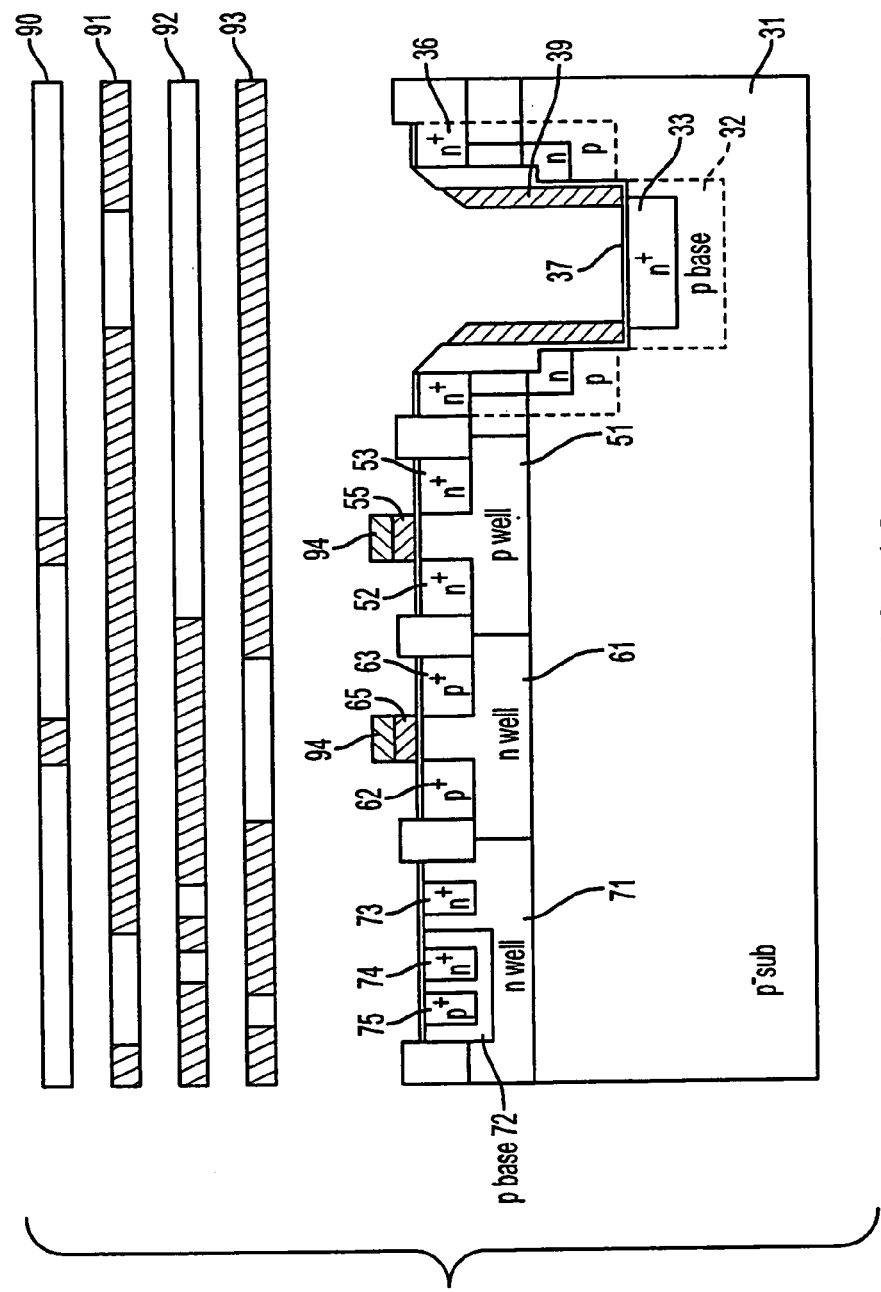

Referring to FIG. 10, resist masks 94 are formed by using a mask 90 having a pattern for forming the gate electrodes 55 and 65 of the CMOS device. The gate electrode 55 of the NMOSFET 201 and the gate electrode 65 of the PMOSFET 301 are formed by selectively removing the polysilicon layer 89 using the resist mask 94. In the active region, the gate electrode 39 of the TLPM 101 remains only on the side wall of the trench 37. Although not illustrated, the gate electrode 39 of the TLPM 101 is led out to the substrate 31 surface in the gate region.

Then, the p-type base region 32 of the TLPM 101 and the p-type base region 72 of the NPN bipolar transistor 401 are formed by using a mask 91 having a pattern for forming the base regions 32 and 72. The n-type source region 33 of the TLPM 101; the n-type drain region 36 of the TLPM 101; the n-type diffusion regions 52 and 53, one of which will operate as the source and the other as the drain of the NMOSFET 201; and the n-type diffusion regions 73 and 74, one of which will operate as the emitter and the as the collector of the NPN bipolar transistor 401, are formed by using a mask 92 having a pattern for forming these n-type diffusion regions.

Then, p-type diffusion regions 62 and 63, one of which will operate as the source and the other as the drain of the PMOSFET 301, and the p-type diffusion region 75 of the NPN bipolar transistor 401 are formed by using a mask 93 having a pattern for forming these p-type diffusion regions.

Figure 11:
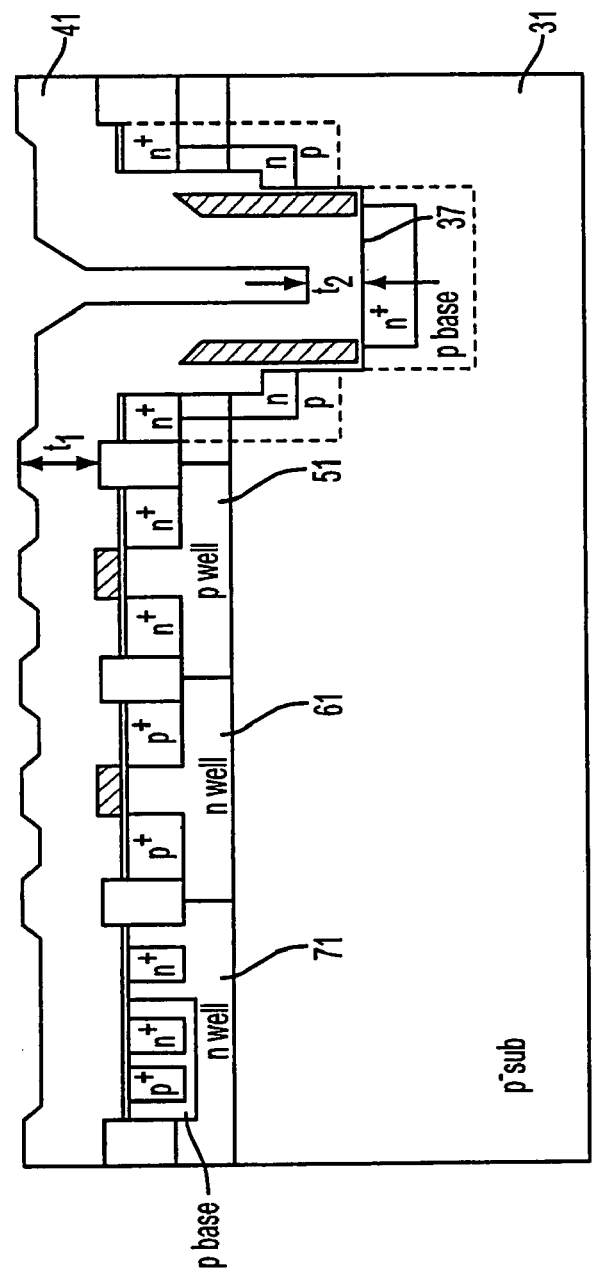

Referring to FIG. 11, an interlayer oxide film 41 having a thickness t1 of, for example, about 1.2 μm is deposited on the substrate 31 surface by film deposition techniques such as low pressure chemical vapor deposition (LPCVD) and phosphorous doped tetraethylorthosilicate (P-TEOS). Because the growth rate of the oxide film inside the trench 37 is about 50% of the growth rate of the oxide film on the substrate 31 surface, the resulting thickness t2 of the interlayer oxide film 41 inside the trench 37 is about 0.6 μm.

Figure 12:
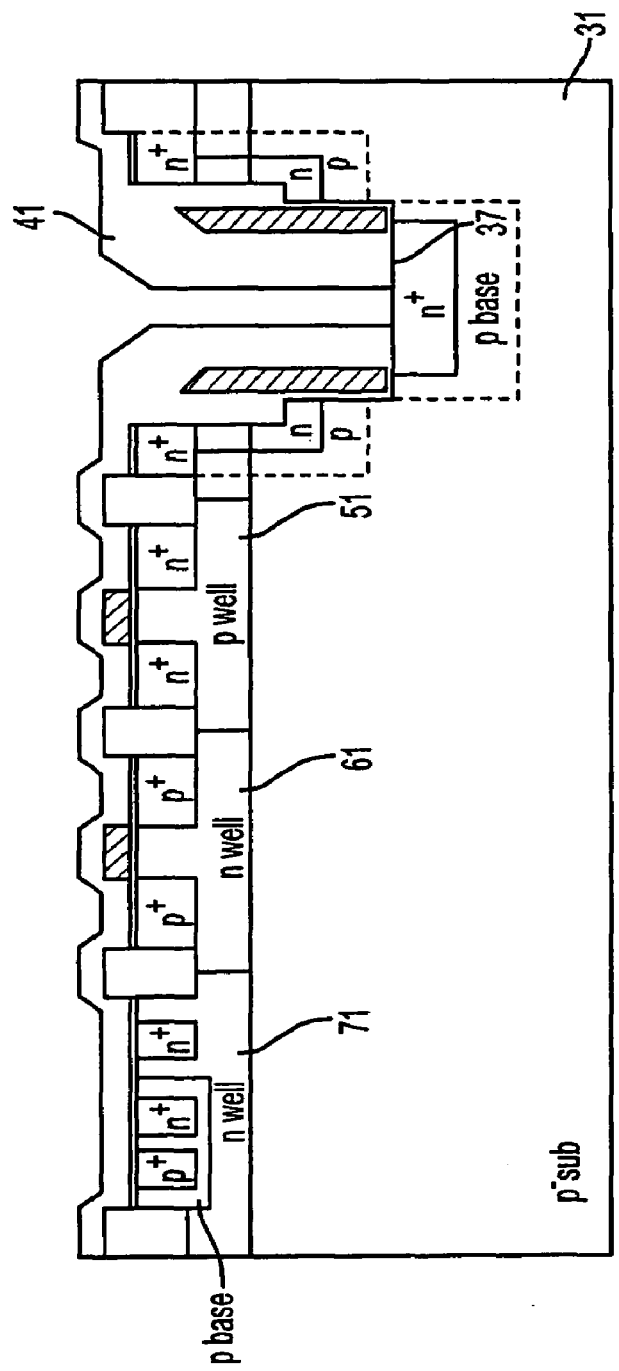

Referring to FIG. 12, the interlayer oxide film 41 is etched down to about 0.6 μm in thickness by anisotropic etching. By the anisotropic etching, a contact hole is formed in the bottom of the trench 37, the substrate 31 is exposed in the bottom of the trench 37, and the surface portions of the other devices 201, 301, and 401 are covered by the interlayer oxide film 41.

Figure 13:
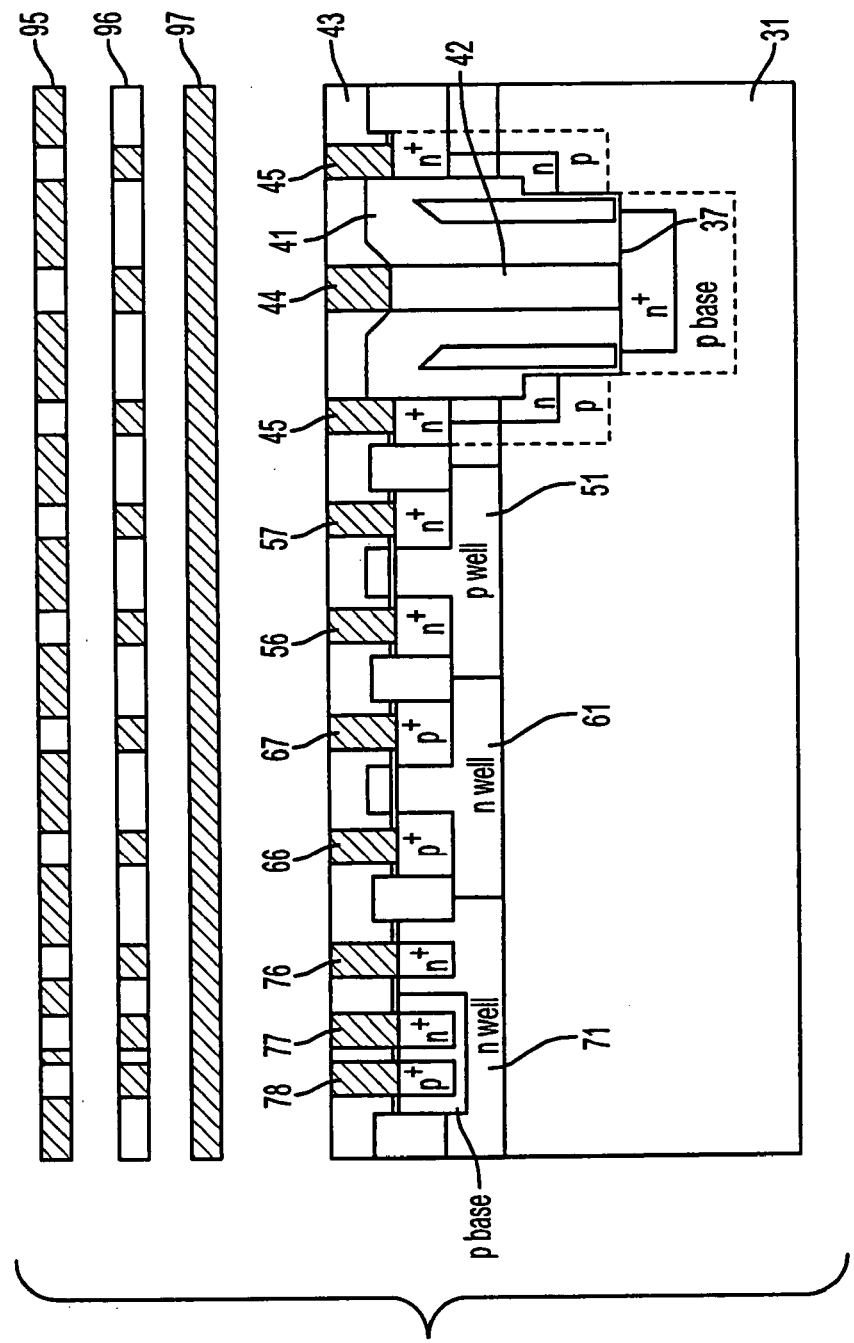
Figure 14:
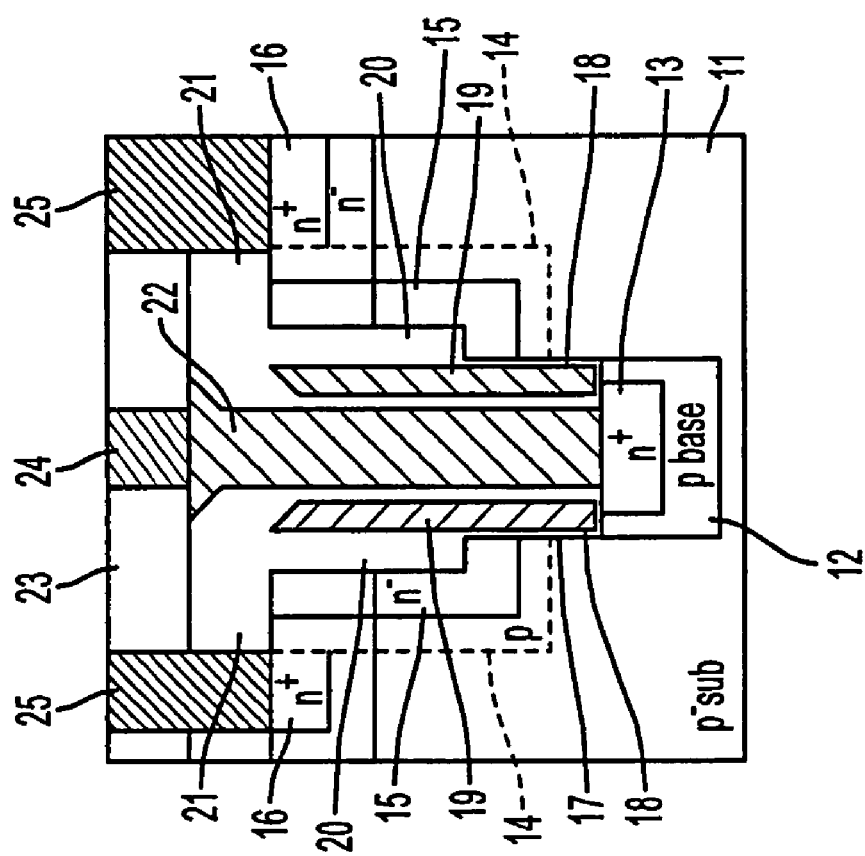
FIG. 14 is a cross-sectional view of the active region of a conventional TLPM.

Referring to FIG. 13, the trench 37 is filled with polysilicon to form a polysilicon contact electrode 42 of the TLPM 101 by depositing polysilicon inside the trench 37 and by etching back the deposited polysilicon.

Then, an oxide film 43 is formed on the interlayer oxide film 41 and the contact electrode 42. Electrode contact holes are formed by using a mask 95 having a pattern for forming the contact holes. Then, a metal film is deposited. The metal electrodes 44 and 45 for the source and the drain of the TLPM 101, the metal gate electrode (not shown) of the TLPM 101, the metal electrodes 56 and 57 for the source and the drain of the NMOSFET 201, the metal electrodes 66 and 67 for the source and the drain of the PMOSFET 301, the metal electrodes 76 and 77 for the emitter and the collector of the NPN bipolar transistor 401, and the metal electrode 78 for the base of the NPN bipolar transistor 401 are formed by using a mask 96 having a pattern for forming these metal electrodes. Then, a passivation film (not shown) is deposited, and pad regions (not shown) are opened by using a mask 97 having a pattern for forming these pad regions. The semiconductor integrated circuit device shown in FIG. 1 is manufactured as described above.

In summary, the manufacturing method according to the first embodiment described above includes the following steps. A first trench etching is performed to form the trench 37. The p-type body region 34, and the n-type expanded drain region 35 are formed. The thick oxide film 40 is formed only on the side wall of the trench 37. A second trench etching deepens the trench 37. The gate oxide film 38 of the TLPM 101, the gate oxide film 54 of the NMOSFET 201, and the gate oxide film 64 of the PMOSFET 301 are simultaneously formed. The gate electrode 39 of the TLPM 101, the gate electrode 55 of the NMOSFET 201, and the gate electrode 65 of the PMOSFET 301 are simultaneously formed. The p-type base region 32 of the TLPM 101 and the p-type base region 72 of the NPN bipolar transistor are simultaneously formed. The n-type source and drain regions 33 and 36 of the TLPM 101; the n-type diffusion regions 52 and 53, one of which will be the source and the other the drain of the NMOSFET 201; and n-type diffusion regions 73 and 74, one of which will be the emitter and the other the collector of the NPN bipolar transistor 401 are simultaneously formed. The p-type diffusion regions 62 and 63, one of which will be the source and the other the drain of the PMOSFET 301, and the p-type diffusion region 75, which will be the base of the NPN bipolar transistor 401 are simultaneously formed. The trench 37 with the contact electrode 42 through the interlayer oxide film 41, and electrodes 44, 45, 56, 57, 66, 67, 76, 77 and 78 are formed. Therefore, a semiconductor integrated circuit device, which integrates a TLPM and a BiCMOS on the same semiconductor substrate, is obtained by adding the process of forming a trench to the BiCMOS process.

The semiconductor integrated circuit device according to the first embodiment of the invention is more advantageous for improving the efficiency of the power supply system thereof than the semiconductor integrated circuit device that integrates a planar power MOSFET and a BiCMOS. Therefore, the semiconductor integrated circuit device according to the first embodiment of the invention facilitates reducing the size of the package and the size of the total system and simplifying the thermal design. Because the semiconductor integrated circuit device according to the first embodiment of the invention facilitates reducing the number of constituent parts and elements and reducing the number of manufacturing steps, the semiconductor integrated circuit device according to the first embodiment is more advantageous for reducing the manufacturing costs thereof, reducing the size of the system, reducing noise, and improving the reliability thereof than the combined system, which combines a discrete TLPM and an IC including a BiCMOS.

Because a MOS transistor is formed without using masks on the side wall of the trench 37 according to preferred embodiments of the invention, it is unnecessary to precisely position the mask forming the trench 37. Thus, extra pitch is not needed between the devices, taking the mask positioning error into consideration and, thus, it is possible to minimize the device pitch. The drift region and the channel region, which are to be spaced apart widely enough to obtain a high breakdown voltage, are arranged vertically along the side wall of the trench 37 according to the invention. This vertical arrangement of the drift region and the channel region facilitates reducing the device pitch. Because the drift and channel regions, which determine the device pitch, are limited to the contact regions for the sources and the drains, the semiconductor integrated circuit device according to preferred embodiments of the invention becomes more advantageous than the integrated structure including the conventional planar power MOSFET as the integration densities thereof become higher.

Although the invention has been described in connection with the preferred embodiments thereof, changes and modifications are obvious to those skilled in the art without departing from the gist of the invention. For example, diffusion resistance and capacitance may be additionally formed on the same semiconductor substrate. The NMOSFET 201, the PMOSFET 301 or the bipolar transistor 401 may be omitted from the semiconductor integrated circuit device according to embodiments of the invention. The insulation film is not limited to the oxide film.

After the second trench etching, the oxide film 83 on the substrate 31 surface may be alternatively removed by wet etching using a dilute hydrofluoric acid solution of around 1%. Because the silicon body surface is not exposed to plasma, the wet etching facilitates suppressing the damage caused by removing the oxide film 83 at a minimum level. Therefore, the wet etching facilitates improving the reliability of the gate oxide films formed later.

In forming the mask of nitride film 87 for forming LOCOS oxide film 30, a part of the nitride film 87 may be selectively removed by wet etching using a phosphoric acid etchant. The wet etching is more advantageous than the chemical dry etching to reduce the damage caused by removing the nitride film 87.

The implanted ion concentration in the p-type base region 32 of the TLPM 101 and the implanted ion concentration in the p-type base region 72 of the NPN bipolar transistor 401 may be made to differ from one another by using a photomask. When the implanted ion concentrations in the p-type base regions 32 and 72 differ from one another, punch-through may be avoided by setting the threshold voltage of the TLPM 101 to about 0.8 V, the surface impurity concentration of the p-type base region 32 to about $1\times10^{17}$ cm$^2$, and the diffusion depth to about 1 μm. At the same time, the current amplification factor of the NPN bipolar transistor 401 may be improved to about 60 by setting the surface impurity concentration of the p-type base region 72 to about $5\times10^{16}$ cm$^2$ and the diffusion depth to about 1 μm. The settings described above facilitate improving the performance of analog circuits such as OP amplifiers, etc.

The many features and advantages of the invention are apparent from the detailed specification and, thus, it is intended by the appended claims to cover all such features and advantages of the invention that fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A method of manufacturing a semiconductor integrated circuit device having a semiconductor substrate, a planar bipolar transistor exhibiting a low breakdown voltage on the semiconductor substrate, and a trench lateral MOSFET exhibiting a high breakdown voltage, the method comprising:

forming two or more well regions of a second conductivity type in a surface of the semiconductor substrate;

forming an oxide film on the surface of the semiconductor substrate to form a mask;

forming a trench in one of the well regions for forming the trench lateral MOSFET using the oxide mask;

forming an expanded drain region of the second conductivity type around the trench;

forming a thick oxide film on an inner side wall of the trench;

etching a bottom of the trench to a level that is deeper than a lower edge of the expanded drain region using the thick oxide film as a mask;

removing the oxide film on the surface of the semiconductor substrate;

forming a nitride mask on the surface of the semiconductor substrate and an inner surface of the trench, the mask being a nitride film, and a part thereof being selectively removed;

forming a selective oxide film using the nitride mask;

forming a gate oxide film inside the trench;

forming a gate electrode on the gate oxide film;

forming a base region of a first conductivity type selectively in the bottom of the trench and forming a base region of the first conductivity type selectively in one of the well regions of the second conductivity type for forming the planar bipolar transistor;

forming a source region of the second conductivity type in the bottom of the trench, the base region being deeper than the source region, and forming a drain region of the second conductivity type outside an upper portion of the trench;

selectively forming a first diffusion region of the second conductivity type in the well region of the second conductivity type for forming the planar bipolar transistor, the first diffusion region operating as an emitter or a collector of the planar bipolar transistor;

selectively forming a second diffusion region of the second conductivity type in the base region of the first conductivity type, which is formed in the well region of the second conductivity type for forming the planar bipolar transistor, the second diffusion region operating as a collector or an emitter of the planar bipolar transistor;

selectively forming a third diffusion region of the first conductivity type in the base region of the first conductivity type, which is formed in the well region of the second conductivity type for forming the planar bipolar transistor, the third diffusion region operating as a base of the planar bipolar transistor;

forming an interlayer insulation film on the surface of the semiconductor substrate and inside the trench;

removing a portion of the interlayer insulation film on the bottom of the trench to expose the source region;

filling the trench with a contact electrode; and forming a metal electrode connected to the contact electrode, forming a metal electrode connected to the gate electrode, forming a metal electrode connected to the drain region, and forming metal electrodes connected to the respective diffusion regions.

2. The method of claim 1, wherein the oxide film on the surface of the substrate is removed by dry etching after the bottom of the trench is etched.

3. The method of claim 1, wherein the oxide film on the surface of the substrate is removed by wet etching after the bottom of the trench is etched.

4. The method of claim 1, wherein the part of the nitride film operating as a mask for forming the selective oxide film is removed by dry etching.

5. The method of claim 1, wherein the part of the nitride film operating as a mask for forming the selective oxide film is removed by wet etching using a phosphoric acid etchant.

6. The method of claim 1, wherein an impurity concentration in the base region of the first conductivity type formed in the bottom of the trench and an impurity concentration in the base region of the first conductivity type formed selectively in the well region of the second conductivity type for forming the planar bipolar transistor differ from one another.

7. The method of claim 1, wherein the portion of the interlayer insulation film on the surface of the semiconductor substrate is thicker than the portion of the interlayer insulation film inside the trench, and the interlayer insulation film is etched by anisotropic etching to remove the portion of the interlayer insulation film in the bottom of the trench.

* * * * *